United States Patent [19]
Takahata

[11] Patent Number: 4,751,419

[45] Date of Patent: Jun. 14, 1988

[54] PIEZOELECTRIC OSCILLATION ASSEMBLY INCLUDING SEVERAL INDIVIDUAL PIEZOELECTRIC OSCILLATION DEVICES HAVING A COMMON OSCILLATION PLATE MEMBER

[75] Inventor: Daisuke Takahata, Kawajima

[73] Assignee: Nitto Incorporated, Saitama, Japan

[21] Appl. No.: 940,540

[22] Filed: Dec. 10, 1986

[51] Int. Cl.[4] .......... H01L 41/08

[52] U.S. Cl. .......... 310/324; 310/322

[58] Field of Search .......... 310/321, 322, 324, 334, 310/800, 337; 179/110 R

[56] References Cited

U.S. PATENT DOCUMENTS

| | | | |
|---|---|---|---|
| 3,150,347 | 9/1964 | Hanish | 310/337 X |
| 3.745,384 | 7/1973 | Blanchard | 310/324 |
| 3,970,878 | 7/1976 | Berglund | 310/337 |
| 4,284,921 | 8/1981 | Lemonon et al. | 310/322 X |
| 4,641,054 | 2/1987 | Takahata et al. | 310/324 |

*Primary Examiner*—Mark O. Budd
*Attorney, Agent, or Firm*—Wegner & Bretschneider

[57] ABSTRACT

In this piezoelectric oscillation assembly there are included several piezoelectric oscillation devices, each including a first oscillation plate, a piezoelectric oscillation element attached to the first oscillation plate, and a second oscillation plate layered against the first oscillation plate so as to define an acoustically enclosed space between them. At least one of the oscillation plates is common to all of the several piezoelectric oscillation devices. It may be the first oscillation plate which is common to these several piezoelectric oscillation devices, or the second oscillation plate, or both. And the acoustically enclosed spaces of these several piezoelectric oscillation devices may be mutually isolated, or alternatively a one common acoustically enclosed space may be defined between the first oscillation plate and the second oscillation plate for all of these several piezoelectric oscillation devices.

5 Claims, 4 Drawing Sheets

PIEZOELECTRIC OSCILLATION ASSEMBLY INCLUDING SEVERAL INDIVIDUAL PIEZOELECTRIC OSCILLATION DEVICES HAVING A COMMON OSCILLATION PLATE MEMBER

BACKGROUND OF THE INVENTION

The present invention relates to a composite type piezoelectric oscillation assembly, and more particularly relates to such a composite type piezoelectric oscillation assembly, particularly suitable for use in a piezoelectric loudspeaker or a piezoelectric microphone or the like device.

In U.S. patent application Ser. No. 748,616, which it is not intended hereby to admit as prior art to the present patent application except to the extent in any case required by applicable law, there is disclosed a piezoelectric oscillation device which is suitable for use in a piezoelectric loudspeaker or a piezoelectric microphone or the like device, and which incorporated a piezoelectric oscillation element as a portion thereof. According to this piezoelectric oscillation device, the piezoelectric oscillation element is bonded to a first oscillation plate which is greater in diameter than said piezoelectric oscillation element, and then a second oscillation plate is bonded to the first oscillation plate so as to define an acoustically enclosed space at least in front of or behind said piezoelectric oscillation element, whereby reproduced sound of a wide frequency range and high fidelity, i.e. highly crisp sound, can be obtained.

SUMMARY OF THE INVENTION

The present inventive entity has further applied efforts in the development of piezoelectric oscillation devices, and has discovered that a compound structure made up from a plurality of such piezoelectric oscillation elements has particular advantages with regard to quality of sound production and so on.

Accordingly, it is the primary object of the present invention to provide a piezoelectric oscillation assembly which incorporates a plurality of piezoelectric oscillation devices each incorporating a piezoelectric oscillation element into an integral entity.

It is a yet further object of the present invention to provide such a piezoelectric oscillation assembly, for use as a loudspeaker or the like, which has good characteristics with regard to frequency response.

It is a yet further object of the present invention to provide such a piezoelectric oscillation assembly, for use as a loudspeaker or the like, which has an overall relatively flat frequency response.

It is a yet further object of the present invention to provide such a piezoelectric oscillation assembly, for use as a loudspeaker or the like, with which in particular the response at various frequencies can be selectively accentuated.

It is a yet further object of the present invention to provide such a piezoelectric oscillation assembly, for use as a loudspeaker or the like, which can reproduce relatively crisp sound.

It is a yet further object of the present invention to provide such a piezoelectric oscillation assembly, for use as a loudspeaker or the like, which can produce a good output sound level.

It is a yet further object of the present invention to provide such a piezoelectric oscillation assembly, which is simple in construction.

It is a yet further object of the present invention to provide such a piezoelectric oscillation assembly, which has the number of its component parts minimized.

It is a yet further object of the present invention to provide such a piezoelectric oscillation assembly, which minimizes the cost of its said component parts.

It is a yet further object of the present invention to provide such a piezoelectric oscillation assembly, which maximizes manufacturing efficiency.

It is a yet further object of the present invention to provide such a piezoelectric oscillation assembly, which minimizes cost of assembly.

It is a yet further object of the present invention to provide such a piezoelectric oscillation assembly, which has an overall low cost.

It is a yet further object of the present invention to provide such a piezoelectric oscillation assembly, which is compact and light in weight.

It is a yet further object of the present invention to provide such a piezoelectric oscillation assembly, which is readily suitable for being fitted to an object such as a blackboard or a panel or the like.

According to the most general aspect of the present invention, these and other objects are attained by a piezoelectric oscillation assembly comprising a plurality of piezoelectric oscillation devices, each comprising: a first oscillation plate; a piezoelectric oscillation element attached to said first oscillation plate; and: a second oscillation plate layered against said first oscillation plate so as to define an acoustically enclosed space between them; wherein at least one of said oscillation plates is common to said plurality of piezoelectric oscillation devices.

According to such a piezoelectric oscillation assembly as specified above, since for each piezoelectric oscillation device the first oscillation plate thereof with the piezoelectric oscillation element need merely to be bonded to the second oscillation plate, and since the several piezoelectric oscillation devices are mutually integrated by at least one of said first and said second oscillation plates being common to said several piezoelectric oscillation devices, thereby the functions of the several piezoelectric oscillation elements are readily combined for producing a loud and a crisp sound. Moreover, by appropriately changing the dimensions and the shapes of the various piezoelectric oscillation elements and of the portions of the first and second oscillation plates appertaining to them, the composite frequency range of the piezoelectric oscillation assembly as a whole can be simply and drastically varied.

According to a particular specialization of the present invention, the above and other objects may more particularly be accomplished by such a piezoelectric oscillation assembly as specified above, wherein it is said first oscillation plate is common to said plurality of piezoelectric oscillation devices; or, alternatively, wherein it is said second oscillation plate is common to said plurality of piezoelectric oscillation devices; or, alternatively, wherein both said first and said second oscillation plate are common to said plurality of piezoelectric oscillation devices. Further, said acoustically enclosed spaces of said plurality of piezoelectric oscillation devices may be mutually isolated, or alternatively a one common said acoustically enclosed space may be defined between said first oscillation plate and said second oscillation plate for all of said plurality of piezoelectric oscillation devices. Any one or combination of these various possibilities may be appropriate, depending upon circumstances.

BRIEF DESCRIPTION OF THE DRAWINGS

The present invention will now be described with respect to the preferred embodiments thereof, and with reference to the illustrative drawings appended hereto, which however are provided for the purposes of explanation and exemplification only, and are not intended to be limitative of the scope of the present invention in any way, since this scope is to be delimited solely by the accompanying claims. With relation to the figures, spatial terms are to be understood as referring only to the orientation on the drawing paper of the illustrations of the relevant parts, unless otherwise specified; like reference numerals, unless otherwise so specified, denote the same parts and gaps and spaces and so on in the various figures relating to one preferred embodiment, and like parts and gaps and spaces and so on in figures relating to different preferred embodiments; and:

DESCRIPTION OF THE PREFERRED EMBODIMENTS

The present invention will now be described with reference to the preferred embodiments thereof, and with reference to the figures.

The First Preferred Embodiment

Figure 1:
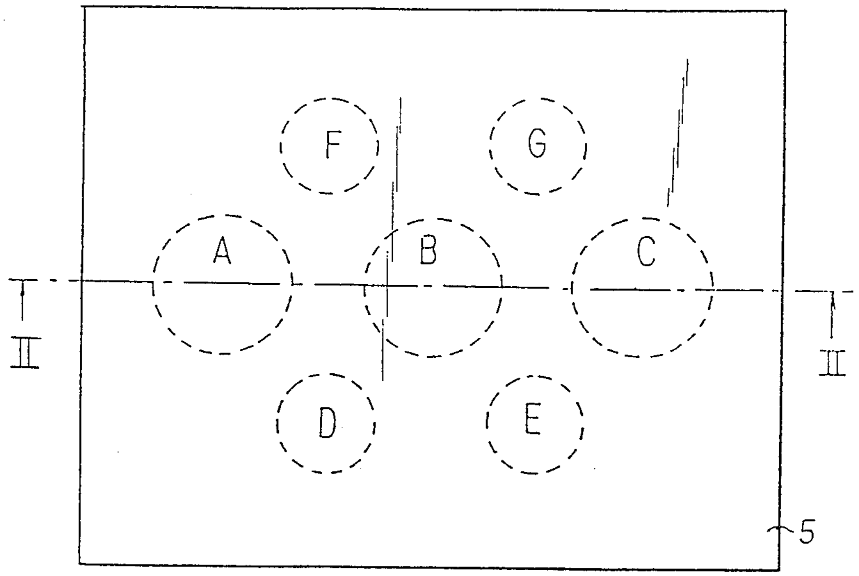
FIG. 1 is a plan view of the first preferred embodiment of the piezoelectric oscillation assembly of the present invention, particularly showing a main or common oscillation plate incorporated therein.
Figure 2:
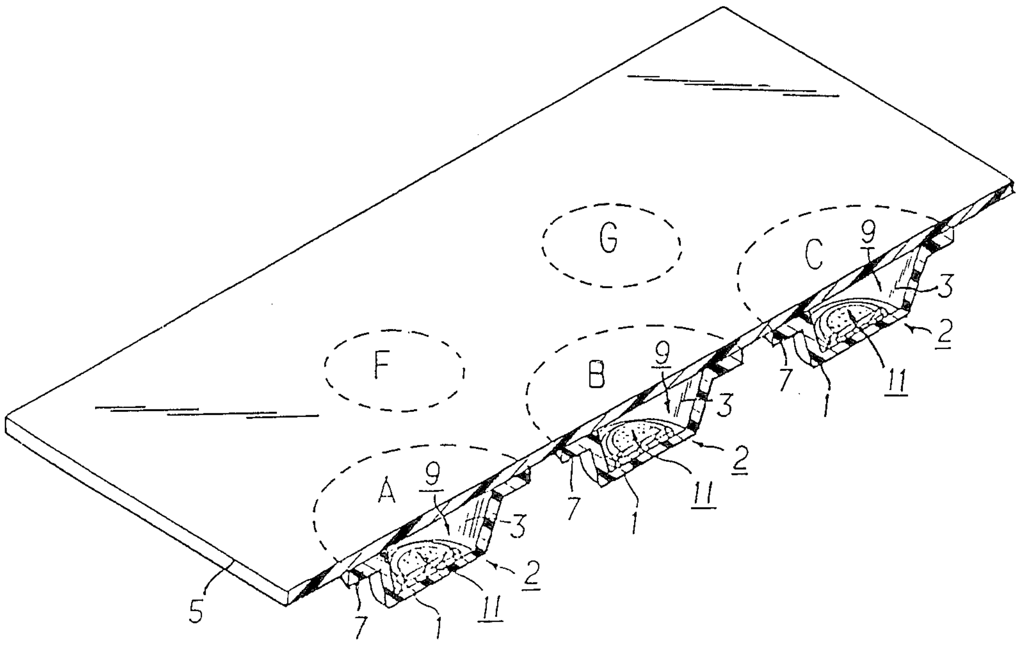
FIG. 2 is a perspective sectional view of said first preferred embodiment of the piezoelectric oscillation assembly of the present invention, as taken in a plane shown by the arrows II—II in FIG. 1.
Figure 3:
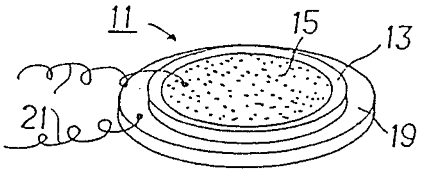
FIG. 3 is a perspective view showing an exemplary one of certain piezoelectric oscillation elements incorporated in said first preferred embodiment.

FIGS. 1 through 3 relate to the first preferred embodiment of the piezoelectric oscillation assembly of the present invention.

In FIG. 1, a plan view is shown of a main or common oscillation plate 5, which is formed as a plate member which is relatively large in size and is made of a material such as plastic film or the like. FIG. 2 shows a sectional view of said common oscillation plate 5 as taken in a plane shown by the arrows II—II in FIG. 1, and further shows three units A, B, and C of a plurality of individual unit piezoelectric oscillation devices denoted as A through G in the figures, each of said piezoelectric oscillation devices A through G comprising, as well as a portion of said common oscillation plate 5, an individual oscillation unit denoted as 2, which is relatively small in size and is mounted, as for example by bonding, to the back of said common oscillation plate 5 from the point of view of FIG. 1, none of said individual oscillation units 2 therefore being visible in that figure. Each of these individual oscillation units 2 comprises a hollow cap shaped individual oscillation plate 1 which is secured by a peripheral flange 7 formed around its outer edge to the rear surface of the common oscillation plate 5 and is also formed with a bowl shaped cavity 3 surrounded by said peripheral flange 7, with a piezoelectric oscillation element 11 being mounted, as for example by bonding, on the bottom of said cavity 3 so as to be received in an acoustically enclosed space 9 defined between the individual oscillation plate 1 and the common oscillation plate 5. The cavity 3 in each of the individual oscillation plates 1 is formed as slightly wider at its open end proximate to its peripheral flange 7 and abutted against the common oscillation plate 5, than at its closed bottom end where the piezoelectric oscillation element 11 is mounted. The individual oscillation plates 1 may also be formed of a material such as plastic film or the like, and they may be bonded to the common oscillation plate 5 by thermal bonding or by an adhesive agent or by other per se known means. And, preferably, the common oscillation plate 5 is formed as somewhat thicker and more stiff than the individual oscillation plates 1, so that said common oscillation plate 5 is not easily deformed even when mounted with a plurality of the individual oscillation units as shown in the exemplary construction.

An exemplary one of the piezoelectric oscillation elements 11 is shown in perspective view in FIG. 3: it is of a per se known structure, and comprises a disk shaped piezoelectric plate member 13, a pair of silver electrodes 15 and 17 bonded to the opposite circular end surfaces of said piezoelectric plate member 13 (the electrode 17 is hidden from the point of view of FIG. 3), and a disk shaped electroconductive plate 19 which is somewhat greater in diameter than the piezoelectric plate member 13 and onto which the electrode 17 is bonded, thus to secure the piezoelectric plate member 13 to said disk shaped electroconductive plate 19. And this piezoelectric oscillation element 11 is secured to the individual oscillation plate 1 by its disk shaped electroconductive plate 19 being bonded to the surface of said individual oscillation plate 1. Lead wires 21 are connected to the electrode 15 and to the disk shaped electroconductive plate 19 which is electrically connected to the other electrode 17.

As shown in FIG. 2, the piezoelectric oscillation devices A through G may differ in size but are preferred to be of similar structures. The lead wires 21 of each of said piezoelectric oscillation devices A through G are led out through the sides of the cavities 3 thereof, although this is not particularly shown in any of the figures, and then are connected to a drive circuit not particularly detailed herein.

This piezoelectric oscillation assembly functions as follows.

When a drive signal is supplied to the piezoelectric oscillation elements 11 of each of the piezoelectric oscillation devices A through G from the per se conventional drive means which is not particularly shown, each of said piezoelectric oscillation elements 11 undergoes individual bending oscillation, and thus causes its individual oscillation plate 1 to oscillate by way of its disk shaped electroconductive plate 19. Since the acoustically enclosed space 9 of this piezoelectric oscillation device A through G is defined between its individual oscillation plate 1 and the common oscillation plate 5, the sound pressure level at the resonance frequency of the piezoelectric oscillation element 11 and of the individual oscillation plate 1 is slightly reduced, while the common oscillation plate 5 is caused to oscillate. Because the resonance frequencies of the piezoelectric oscillation elements 11, the individual oscillation plates 1, and the common oscillation plate 5 generally differ from the one another, the overall frequency characteristic tends to be relatively flat. This feature can be accentuated by, as suggested in FIG. 1, forming the piezoelectric oscillation devices A through G of different sizes or diameters.

Thus, when this piezoelectric oscillation assembly of the present invention is used as a piezoelectric loudspeaker by applying a drive signal of various frequencies, not only can a satisfactory sound level be obtained, but also the produced sound signal can be relatively crisp.

Since the plurality of piezoelectric oscillation devices A through G are combined, an overall relatively high level or amplitude of sound can be obtained, and it is possible to accentuate certain frequency ranges in a selective manner and to obtain various different appropriate frequency characteristics, by appropriately varying the sizes (diameters) of the various different piezoelectric oscillation devices A through G.

Furthermore, since the piezoelectric oscillation devices A through G can be manufactured simply by bonding the individual oscillation plates 1 to the common oscillation plate 5, and since thus the common oscillation plate 5 is common to all of the individual piezoelectric oscillation devices A through G, not only is the number of component parts minimized but also the structure is rendered simple and thus made easy to make. Accordingly manufacturing efficiency is maximized, and manufacturig cost is minimized, thus making for a relatively cheap product. The finished product is also relatively compact and light in weight.

If a printed electroconductive pattern is formed on the individual oscillation plates 1 and optionally also on the common oscillation plate 5 for conducting the electrical signals which drive the piezoelectric oscillation elements 11, instead of utilizing the lead wires 21 as shown above, then there is no requirement to pass such lead wires 21 through the sides of the cavities 3 of the individual oscillation plates 1, and accordingly manufacturing and production efficiency can be further enhanced.

Although in this shown first preferred embodiment of the piezoelectric oscillation assembly of the present invention there were utilized the disk shaped electroconductive plates 19, these are not essential to the present inventive concept, and in other possible embodiments it would be possible to structure the piezoelectric oscillation element so as to only incorporate a disk shaped piezoelectric plate member such as the member 13 of the shown first preferred embodiment, along with electrodes 15 and 17 on the opposite sides thereof.

A Modification

Figure 4:
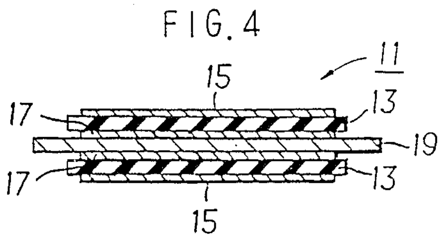
FIG. 4 is a transverse sectional view of a piezoelectric oscillation element incorporated in a modified version of said first preferred embodiment.

In FIG. 4, the piezoelectric oscillation element 11 incorporated in a modification of this first preferred embodiment of the piezoelectric oscillation assembly of the present invention is shown in transverse sectional view. In this figure, parts which correspond to analogous parts of the first preferred embodiment are denoted by like reference numerals. In this case, the piezoelectric oscillation element 11 is of a bimorph structure, with a disk shaped electroconductive plate 19 sandwiched in between a pair of piezoelectric plate members 13, each having electrodes 15 and 17 on its opposite surfaces. Thereby, the sound pressure level produced by this piezoelectric oscillation element 11 is increased. Otherwise, the same functions and advantages as described above are available, also with this modification of the first preferred embodiment of the piezoelectric oscillation assembly of the present invention.

Another Modification

Figure 5:
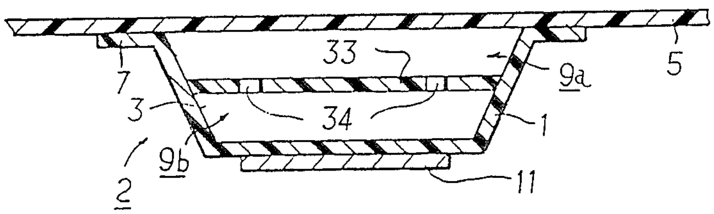
FIG. 5 is a transverse sectional view of a piezoelectric oscillation device incorporated in another modified version of said first preferred embodiment.

In FIG. 5, a transverse sectional view is shown of one of the piezoelectric oscillation devices of another modification of this first preferred embodiment of the piezoelectric oscillation assembly of the present invention. In this figure, parts and spaces which correspond to analogous parts and spaces of the first two versions of said first preferred embodiment are denoted by like reference numerals. This piezoelectric oscillation device is modified from the one shown in FIG. 2, in that the cavity 3 defined in the individual oscillation plate 1 is separated into two parts by a division plate 33, through which a plurality of through holes 34 are formed. Thus, the acoustically enclosed space 9 is divided into an upper space 9*a* and a lower space 9*b*. And the piezoelectric oscillation element 11 is attached to the outside surface of the portion of the individual oscillation plate 1 which defines the bottom of the lower space 9*b*, rather than to the inside surface of said individual oscillation plate 1 as was the case with the first variation of this first preferred embodiment described above. This addition of another component member having a different resonance frequency from the previously described component members makes the overall frequency response even flatter than before, and therefore the functions and advantages described above with relation to the first variation of this first preferred embodiment are available to an even greater extent than in the case of said first variation; and accordingly detailed description thereof will be foregone.

The Second Preferred Embodiment

Figure 6:
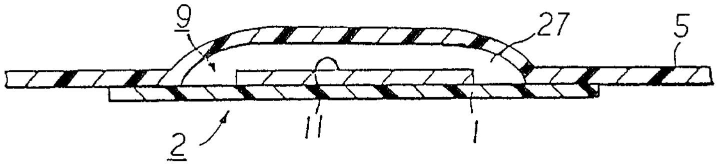
FIG. 6 is a transverse sectional view, similar to FIG. 5 for said second variation of said first preferred embodiment, showing a piezoelectric oscillation device incorporated in a second preferred embodiment of the piezoelectric oscillation assembly of the present invention.

One of the piezoelectric oscillation devices of the second preferred embodiment of the piezoelectric oscillation assembly of the present invention is shown in FIG. 6 in transverse sectional view, similarly to FIG. 5 for the second modification of the first preferred embodiment; again, for convenience, only one such piezoelectric oscillation device is shown, although actually this second preferred embodiment, like the first embodiment of FIGS. 1 through 3, actually comprises a plurality of said piezoelectric oscillation devices. In this figure, parts and spaces which correspond to analogous parts and spaces of the first preferred embodiment are denoted by reference numerals like to those utilized in the figures relating to said first preferred embodiment. The common oscillation plate 5 of these individual oscillation units 2 is formed with a plurality of depressions 27, and the individual oscillation plate 1 of the individual oscillation unit 2 of the illustrated piezoelectric oscillation device (like those of the others thereof) is substantially planar. The piezoelectric oscillation element 11, which may be like that of the first preferred embodiment, is secured to the inner side of the individual oscillation plate 1, within an acoustically enclosed space 9 defined within the depression 27 of the common oscillation plate 5, between said common oscillation plate 5 and the individual oscillation plate 1. The same functions and advantages are available with this second preferred embodiment of the piezoelectric oscillation assembly of the present invention, as were available with the first preferred embodiment, and accordingly detailed description thereof will be eschewed in the interests of brevity of explanation.

Thus, it will be understood that the acoustically enclosed space 9 can be provided either by forming a depression in the individual oscillation plate 1 as was done with this second preferred embodiment, or in the common oscillation plate 5 as was done with the first preferred embodiment in its plural variations. Alternatively, in a further possible variation which is not particularly illustrated, the acoustically enclosed space 9 could be provided by forming mutually cooperating depressions both in said individual oscillation plate 1 and in said common oscillation plate 5. Also, the acoustically enclosed space 9 is only required to be generally defined, in view of the oscillation of the piezoelectric oscillation element 11, and small gaps opening from said acoustically enclosed space 9 to the outside will not cause any particular problem. In short, it suffices if the acoustically enclosed space 9 is defined either in front of or behind said piezoelectric oscillation element 11; alternatively said acoustically enclosed space 9 could be defined as several spaces, one in front of said piezoelectric oscillation element 11 and one behind it.

The Third Preferred Embodiment

Figure 7:
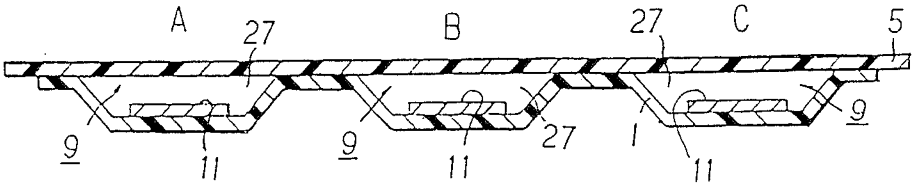
FIG. 7 is a sectional view of the third preferred embodiment of the piezoelectric oscillation assembly of the present invention, taken in a plane which sections several of the piezoelectric oscillation devices thereof transversely, as FIG. 6 does for a single such piezoelectric oscillation device of the second preferred embodiment.

The third preferred embodiment of the piezoelectric oscillation assembly of the present invention is shown in FIG. 7 in a view which sections several of the piezoelectric oscillation devices thereof transversely, as FIG. 6 did for a single such piezoelectric oscillation device of the second preferred embodiment. In this figure, parts and spaces which correspond to analogous parts and spaces of the first and second preferred embodiments are denoted by reference numerals like to those utilized in the figures relating to said first and second preferred embodiments.

In contrast to the construction of the first and the second preferred embodiments in which the common oscillation plate 5 was common to all of the piezoelectric oscillation devices A through G while on the other hand the individual oscillation plates 1 of said various piezoelectric oscillation devices A through G were disjoint, in this third preferred embodiment, on the other hand, also these oscillation plates 1 are constituted as a single second common oscillation plate 1, which is secured to the first common oscillation plate 5 at portions thereof which surround the piezoelectric oscillation devices A through G.

In other words, the second common oscillation plate 1 is formed as a plate which is slightly larger in size than the first common oscillation plate 5, and is then formed (as by pressing or the like) with a plurality of depressions 27 of various sizes corresponding to the sizes required for the various piezoelectric oscillation devices A through G. Then to the bottom surface of each such depression 27 there is fixed a piezoelectric oscillation element 11 like to one of those previously described, and then the first common oscillation plate 5 and the second common oscillation plate 1 are bonded together, in some per se known manner, so as to define acoustically enclosed spaces 9 between them within said depressions 27.

In this third preferred embodiment, because both the first common oscillation plate 5 and also the second common oscillation plate 1 can be made as single sheet members, the number of component parts is reduced and accordingly the difficulty of manufacture and the cost level are reduced. Further, since the second common oscillation plate 1 can be made as a single member by pressing, for example with a single relatively simple metallic die, the manufacturing cost is further reduced the assembly efficiency is increased, and also the loss of material is reduced, thereby obtaining various cost advantages. Otherwise, similar functions and advantages are available with this third preferred embodiment of the piezoelectric oscillation assembly of the present invention, as were available with the first and the second preferred embodiments, and accordingly detailed description thereof will again be foregone.

The Fourth Preferred Embodiment

Figure 8:
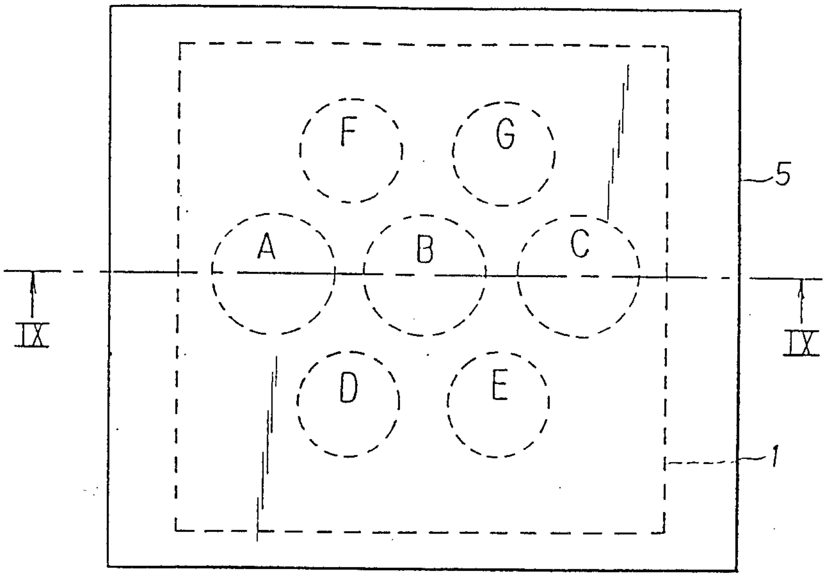
FIG. 8, similarly to FIG. 1 for the first preferred embodiment, is a plan view of the fourth preferred embodiment of the piezoelectric oscillation assembly of the present invention showing a first common oscillation plate incorporated therein by solid lines and a second common oscillation plate incorporated therein by dashed lines.
Figure 9:
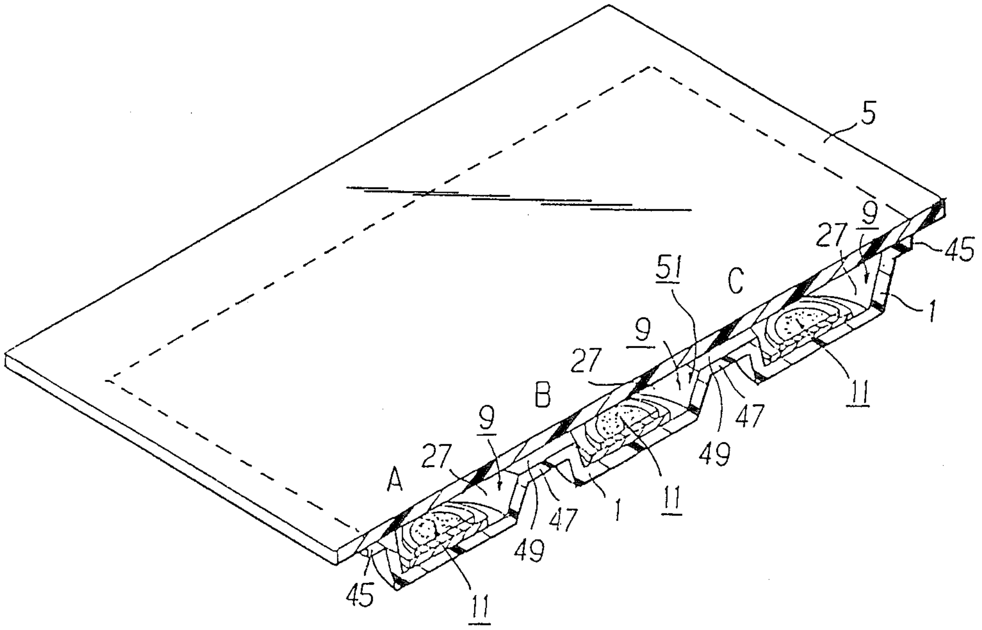
FIG. 9, similarly to FIG. 2 for the first preferred embodiment, is a perspective sectional view of said fourth preferred embodiment of the piezoelectric oscillation assembly of the present invention, as taken in a plane shown by the arrows IX—IX in FIG. 8.
Figure 10:
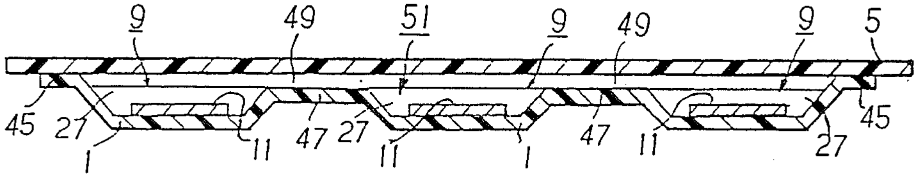
FIG. 10, similarly to FIG. 7 for the third preferred embodiment, is a sectional view of said fourth preferred embodiment of the piezoelectric oscillation assembly of the present invention, taken in a plane which sections several of the piezoelectric oscillation devices thereof transversely and in fact is substantially the same as that of FIG. 9.

The fourth preferred embodiment of the piezoelectric oscillation assembly of the present invention is shown in FIG. 8 in a plan view and in FIG. 9 in a perspective sectional view taken in a plane shown by the arrows IX—IX in FIG. 8, said figures corresponding respectively to FIG. 1 and to FIG. 2 for the first preferred embodiment; and said fourth preferred embodiment is further shown in FIG. 10 in a sectional view, like to the view of the third preferred embodiment shown in Fig. 7, which sections several of its piezoelectric oscillation devices A, B, and C transversely. In these figures, parts and spaces which correspond to analogous parts and spaces of the first through the third preferred embodiments are denoted by reference numerals like to those utilized in the figures relating to said first through third preferred embodiments.

In this fourth preferred embodiment, like the third preferred embodiment, both the oscillation plate 5 and also the second common oscillation plate 1 are common to all of the piezoelectric oscillation devices A through G; but, rather than the second common oscillation plate 1 being secured to the first common oscillation plate 5 at portions thereof which surround the piezoelectric oscillation devices A through G, i.e. over substantially all of its superficies except at said piezoelectric oscillation devices A through G, in fact now said second common oscillation plate 1 is secured (by bonding or the like) to the first common oscillation plate 5 only around its outer periphery at a flange portion 45. Further, the other non peripheral portions 47 of said second common oscillation plate 1 between the piezoelectric oscillation devices A through G are formed as slightly lower than said peripheral portion 45 thereof, so that, when as described above said second common oscillation plate 1 is secured to said first common oscillation plate 5 by its said peripheral portion 45, slight gaps 49 are left between said second common oscillation plate 1 and said first common oscillation plate 5 at said portions 47. These gaps 49 serve to couple together the spaces 9 defined in each of the piezoelectric oscillation devices A through G, thus joining them together into a single compound space 51 and thereby acoustically coupling them together, at least to some extent. This feature of the structure is best seen in FIG. 10. And to the bottom surface of each depression 27 there is fixed a piezoelectric oscillation element 11 like to one of those previously described with respect to the previous preferred embodiments (these piezoelectric oscillation elements 11 are shown as somewhat simplified in the figures).

In this fourth preferred embodiment, because the single acoustically isolated space 51 is defined between the first common oscillation plate 5 and the second common oscillation plate 1, and since said first common oscillation plate 5 is only fixed by its edges to said second common oscillation plate 1, when drive signals are fed to the electrodes 15 and 17 of the piezoelectric oscillation elements 11 of the piezoelectric oscillation devices A through G as in the case of the operation of the previously described preferred embodiments, the portions of the second common oscillation plate 1 attached to said piezoelectric oscillation elements 11 oscillate individually, and this causes the first common oscillation plate 5 to oscillate in a composite manner following the oscillations of said portions of said second common oscillation plate 1, and in this fashion the sound pressure level is kept high, the frequency characteristics are allowed to be made flat, and the adjustment of said frequency characteristics is made easy. Further, since again the first common oscillation plate 5 and the second common oscillation plate 1 can be made as single sheet members, the number of component parts is kept low and the difficulty of manufacture and the cost level are minimized. Again, since the second common oscillation plate 1 can be made as a single member by pressing, for example with a single relatively simple metallic die, the manufacturing cost is further reduced, the assembly efficiency is increased, and also the loss of material is reduced, thus keeping costs down. Otherwise, similar functions and advantages are available with this fourth preferred embodiment of the piezoelectric oscillation assembly of the present invention, as were available with the third preferred embodiment, and accordingly detailed description thereof will again be foregone.

The Fifth Preferred Embodiment

Figure 11:
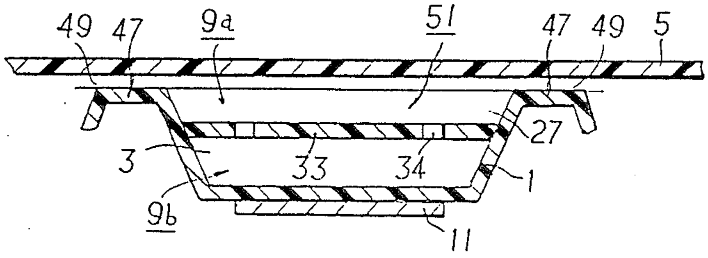
FIG. 11, similarly to FIG. 5 for the second modified version of said first preferred embodiment, is a transverse sectional view of a piezoelectric oscillation device incorporated in a fifth preferred embodiment of the piezoelectric oscillation assembly of the present invention.

One of the piezoelectric oscillation devices incorporated in the fifth preferred embodiment of the piezoelectric oscillation assembly of the present invention is shown in transverse sectional view in FIG. 11, said figure corresponding to FIG. 5 for the second modified version of the first preferred embodiment and providing the same modification over the fourth preferred embodiment of FIGS. 8 through 10, as the FIG. 5 device does over the first preferred embodiment. In this figures, parts and spaces which correspond to analogous parts and spaces of the fourth preferred embodiment are denoted by reference numerals like to those utilized in the figures relating to said fourth preferred embodiment.

In this fifth preferred embodiment, as was done with the second modified version of the first preferred embodiment to produce it from said first preferred embodiment, the cavity 3 defined in the individual oscillation plate 1 is separated into two parts by a division plate 33, through which a plurality of through holes 34 are formed. Thus, as before, the space 9 defined within this depression 27 of the second common oscillation plate 1 (one component portion of the single compound space 51) is divided into an upper space **9*a* and a lower space 9*b*. And, again, the piezoelectric oscillation element 11 is attached to the outside surface of the portion of the individual oscillation plate 1 which defines the bottom of the lower space 9*b*, rather than to the inside surface of said individual oscillation plate 1 as was the case with the fourth preferred embodiment described above. And, as with the fourth preferred embodiment, the second common oscillation plate 1 is secured (by bonding or the like) to the first common oscillation plate 5 only around its outer periphery at a flange portion 45, with the other non peripheral portions 47 of said second common oscillation plate 1 between the piezoelectric oscillation devices A through G being formed as slightly lower than said peripheral portion 45 thereof, so that as before slight gaps 49 are left between said second common oscillation plate 1 and said first common oscillation plate 5 at said portions 47, these gaps 49 again serving to couple together the spaces 9 defined in each of the piezoelectric oscillation devices A through G, thus as before joining them together into a single compound space 51 and thereby acoustically coupling them together. And again to the bottom surface of each depression 27 there is fixed a piezoelectric oscillation element 11**, again shown in a somewhat simplified fashion.

Again in this fifth preferred embodiment, the portions of the second common oscillation plate 1 attached to said piezoelectric oscillation elements 11 oscillate individually, and in this fashion the sound pressure level is kept high, the frequency characteristics are allowed to be made flat, and the adjustment of said frequency characteristics is made easy. And, as before in the case of the FIG. 5 modification, the addition of another component member having a different resonance frequency from the previously described component members makes the overall frequency response even flatter than was the case with the fourth preferred embodiment, and therefore the functions and advantages described above with relation to the fourth preferred embodiment are now available to an even greater extent; accordingly detailed description thereof will be foregone.

The Sixth Preferred Embodiment

Figure 12:
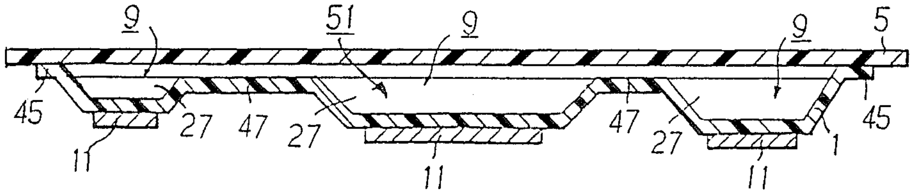
FIG. 12, similarly to FIGS. 7 and 10 for the third and fourth preferred embodiments respectively, is a sectional view of a sixth preferred embodiment of the piezoelectric oscillation assembly of the present invention, taken in a plane which sections several of the piezoelectric oscillation devices thereof transversely.

The sixth preferred embodiment of the piezoelectric oscillation assembly of the present invention is shown in FIG. 12 in a view like the views of FIGS. 7 and 10 which were given for the third and fourth preferred embodiments respectively. In this figure, parts and spaces which correspond to analogous parts and spaces of the previously described preferred embodiments are denoted by reference numerals like to those utilized in the figures relating to said previously described preferred embodiments.

In this sixth preferred embodiment, the modification over the fourth preferred embodiment of FIG. 10 is that, not only are the shapes and the dimensions of the piezoelectric oscillation elements 11 of the piezoelectric oscillation devices A through G varied, but also the depths and the inner diameters of the depressions 27 formed in the second common oscillation plate 1 which define said piezoelectric oscillation devices A through G are varied from one another. Thus, the possibilities for dimensional variation of elements of the construction are increased, and hence it is possible to obtain various desired frequency properties by preferentially accentuating various frequency bands of the sound produced. Otherwise, similar functions and advantages are available with this sixth preferred embodiment of the piezoelectric oscillation assembly of the present invention, as were available with the third preferred embodiments, and accordingly detailed description thereof will again be foregone.

The Seventh Preferred Embodiment

Figure 13:
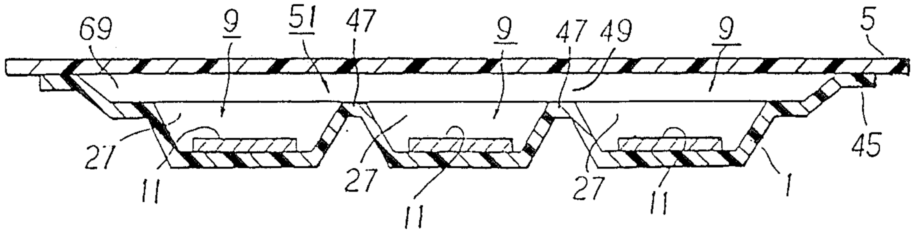
FIG. 13, similarly to FIGS. 7, 10, and 12 for the third, fourth, and sixth preferred embodiments respectively, is a similar sectional view of a seventh preferred embodiment of the piezoelectric oscillation assembly of the present invention.

The seventh preferred embodiment of the piezoelectric oscillation assembly of the present invention is shown in FIG. 13 in a view like the views of FIGS. 7, 10, and 12 which were given for the third, fourth, and sixth preferred embodiments respectively. In this figure, parts and spaces which correspond to analogous parts and spaces of the previously described preferred embodiments are denoted by reference numerals like to those utilized in the figures relating to said previously described preferred embodiments.

In this seventh preferred embodiment, the modification over the fourth preferred embodiment of FIG. 10 is that the a general depression 69 is formed over substantially all of the superficies of the second common oscillation plate 1 except its flange portion 45, and then the individual depressions 27 for the piezoelectric oscillation devices A through G are formed in said general depression 69. Thus, the non peripheral portions 47 of the second common oscillation plate 1 between the piezoelectric oscillation devices A through G naturally become formed as slightly lower than said peripheral portion 45 thereof, so that as before slight gaps 49 are left between said second common oscillation plate 1 and said first common oscillation plate 5 at said portions 47, these gaps 49 as before serving to couple together the spaces 9 defined in each of the piezoelectric oscillation devices A through G, thus as before joining them together into a single compound space 51 and thereby acoustically coupling them together. Otherwise, similar functions and advantages are available with this seventh preferred embodiment of the piezoelectric oscillation assembly of the present invention, as were available with the fourth and sixth preferred embodiments, and accordingly detailed description thereof will again be foregone.

Conclusion

The common oscillation plate 5 and the individual or common oscillation plate or plates 1 of the various embodiments disclosed of this piezoelectric oscillation assembly may be made of any material which is suitable for use as an oscillation cone or diaphragm, as well as the plastic film material suggested above; but in particular the first common oscillation plate 5 is desired to be made of a material having a relatively high elastic modulus, i.e. is desired to be made of a relatively stiff material. Also, it is acceptable, according to the principles of the present invention, if only some of the depressions 27 are fitted with the piezoelectric oscillation elements 11. The present invention can be applied to a piezoelectric microphone, a piezoelectric sensor, or a piezoelectric buzzer, as well as to a piezoelectric loudspeaker as discussed above. In particular, the present invention can be applied to a relatively flat piece of equipment or furniture such as a blackboard, a panel, or the like, and a major surface thereof can be conveniently utilized as the common oscillation plate 5. Thus, although the present invention has been shown and described in terms of the preferred embodiments thereof, and with reference to the appended drawings, it should not be considered as being particularly limited thereby, since the details of any particular embodiment, or of the drawings, could be varied without, in many cases, departing from the ambit of the present invention. Accordingly, the scope of the present invention is to be considered as being delimited, not by any particular perhaps entirely fortuitous details of the disclosed preferred embodiments, or of the drawings, but solely by the scope of the accompanying claims, which follow.

What is claimed is:

1. A piezoelectric oscillation assembly comprising a plurality of piezoelectric oscillation devices, each piezoelectric oscillation device comprising:

- a first oscillation plate;
- a piezoelectric oscillation element attached to said first oscillation plate; and
- a second oscillation plate layered against said first oscillation plate so as to define an acoustically enclosed space between them;
- wherein each of said plurality of piezoelectric oscillation elements is enclosed in a separate acoustically enclosed space and at least one of said oscillation plates is common to said plurality of piezoelectric oscillation devices.

2. A piezoelectric oscillation assembly according to claim 1, wherein said first oscillation plate is common to said plurality of piezoelectric oscillation devices.

3. A piezoelectric oscillation assembly according to claim 1, wherein said second oscillation plate is common to said plurality of piezoelectric oscillation devices.

4. A piezoelectric oscillation assembly according to claim 1, wherein both said first and said second oscillation plate are common to said plurality of piezoelectric oscillation devices.

5. A piezoelectric oscillation assembly comprising:
a first oscillation plate, said first oscillation plate defining a plurality of raised portions and lowered portions;
a plurality of piezoelectric oscillation elements attached to said first oscillation plate, each of said piezoelectric oscillation elements being attached to the first oscillation plate within one of said lowered portions; and
a second oscillation plate layered against said first oscillation plate so as to define an acoustically enclosed space between them, said acoustically sealed space enclosing all of the piezoelectric oscillation elements;
wherein a small air gap is located between the second oscillation plate and the raised portions of said first oscillation plate.

* * * * *